United States Patent [19]

Banitt et al.

[11] Patent Number: 5,587,664
[45] Date of Patent: Dec. 24, 1996

[54] LASER-INDUCED METALLIC PLASMA FOR NON-CONTACT INSPECTION

[75] Inventors: David Banitt, Soreq; Moshe B. Shlomo, Maccabim, both of Israel

[73] Assignee: Exsight Ltd., Soreq, Israel

[21] Appl. No.: 501,685

[22] Filed: Jul. 12, 1995

[51] Int. Cl.[6] ................................. G01R 31/302
[52] U.S. Cl. ............................ 324/752; 324/754
[58] Field of Search ...................... 324/750–754, 324/758, 501, 514, 537

[56] References Cited

U.S. PATENT DOCUMENTS

| | | |
|---|---|---|
| 4,246,793 | 1/1981 | Fairand et al. ............... 73/628 |
| 4,415,851 | 11/1983 | Langner et al. . |
| 4,417,203 | 11/1983 | Pfeiffer et al. . |
| 4,507,605 | 3/1985 | Geisel . |
| 4,600,878 | 7/1986 | Doemens et al. . |
| 4,703,260 | 10/1987 | Beha et al. . |
| 4,705,329 | 11/1987 | Doemens . |
| 4,771,230 | 9/1988 | Zeh . |
| 4,777,432 | 10/1988 | Doemens et al. . |
| 4,843,329 | 6/1989 | Beha et al. . |
| 4,843,330 | 6/1989 | Golladay et al. . |
| 4,845,425 | 7/1989 | Beha et al. . |
| 4,891,578 | 1/1990 | Doemens . |
| 4,967,149 | 10/1990 | Doemens et al. . |
| 4,970,461 | 11/1990 | LePage ..................... 324/752 |
| 4,985,681 | 1/1991 | Brunner et al. . |
| 4,999,577 | 3/1991 | Beha et al. . |
| 5,017,863 | 5/1991 | Mollitz ..................... 324/751 |
| 5,032,788 | 7/1991 | Ringleb et al. . |
| 5,179,279 | 1/1993 | Millard et al. ............ 250/309 |
| 5,202,623 | 4/1993 | LePage ..................... 324/758 |

*Primary Examiner*—Ernest F. Karlsen
*Assistant Examiner*—Russell M. Kobert
*Attorney, Agent, or Firm*—Mark M. Friedman

[57] ABSTRACT

An apparatus for testing an electrical part having a number of conductive paths. The apparatus includes a mechanism for directing a laser pulse to impinge upon a conductor of the part under test so as to form a metallic plasma and one or more pairs of probes which, along with the conductor and the plasma, form a part of an electrical circuit. Finally, the apparatus includes a detector which is responsive to the amount of conduction via the plasma between the conductor and the probes.

18 Claims, 2 Drawing Sheets

LASER-INDUCED METALLIC PLASMA FOR NON-CONTACT INSPECTION

FIELD AND BACKGROUND OF THE INVENTION

The present invention relates to electrical inspection systems and methods and, more particularly, to a systems and methods for the non-contact testing of electrical conductors, such as those found on printed circuit boards (PCB's), liquid crystal devices (LCD's), multi chip modules (MCM's) or integrated circuit devices for electrical continuity or shorts.

Currently known methods for electrical testing of small conductors can be broadly classified into methods which require physical contact of one or more probe with the conductor being tested and methods which do not require such physical contact.

Among the methods which require physical contact are the methods known as 'flying probes' and 'bed of nails'. The 'flying probes' method use metallic probes mounted on an X-Y positioning system. The probes are made to touch a conductor at two points and a potential difference is introduced between the two probes. The potential difference brings about a measurable current flow through the conductor, provided that the conductor is electrically continuous. Inversely, the probes can be made to touch different conductors. In this case a measurable current flow indicates a short circuit between the two ostensibly separate conductors.

In the 'bed of nails' method a matrix of probes is made to contact the printed circuit board. Electrical continuity and/or short circuiting is then monitored through the proper imposition of potential differences between pairs of nails and the simultaneous monitoring of any current through the nails.

Electrical testing methods which rely on physical contact of the probes with the conductors being inspected suffer from at least two basic disadvantages. First, as the size of conductors continues to decrease it becomes harder and harder to effect adequate physical contact, and thus electrical contact, between the probes and the conductor. Second, the physical contact between the probes and the conductors, especially the very small conductors, can often lead to damage of the conductors in the testing process.

To overcome these difficulties, a number of non-contact electrical testing methods have been proposed. Several proposed non-contact methods make use of an electrically-conductive laser-induced plasma which bridges the gap between a probe and the conductor to as to close an electrical circuit between the probes and the conductor without direct physical contact between the probes and the conductor.

U.S. Pat. No. 4,970,461, which is incorporated by reference, discloses placing the circuit board in a gas-filled chamber. A laser is directed to a grid located above the electronic circuit board. The laser induces a discharge from the grid across the field which causes the building up of charge in the node. When the field is reversed a visible plasma is created as the charged node is charged which can be visually observed providing an indication of electrical continuity.

U.S. Pat. No. 5,017,863, which is incorporated by reference, uses a laser beam to impinge on a photoemissive grid located close to the printed circuit board being inspected. Electrons emitted from the grid serve to close the circuit and provide electrical continuity information.

Finally, U.S. Pat. No. 5,202,623, which is incorporated by reference, generates a laser-activated plasma in a small chamber which is subjected to a concentrated laser pulse. The generated plasma exits through an orifice in the chamber and the electrically-conducive plume of ionized gas is used to close a circuit.

A difficulty shared by each of the non-contact electrical inspection methods described above is their inability to accurately test very small conductors.

There is thus a widely recognized need for, and it would be highly advantageous to have, a simple and reliable system and method for the non-contact electrical inspection of conductors which is convenient and accurate in the inspection of even very small features of printed circuit boards, integrated circuits, multi chip modules liquid crystal devices, and the like.

SUMMARY OF THE INVENTION

According to the present invention there is provided an apparatus for testing an electrical part having a plurality of conductive paths thereon, comprising: (a) means for directing a laser pulse to impinge upon a conductor of the part under test so as to form a metallic plasma; (b) at least one pair of probes which, along with the conductor and the plasma, form a part of an electrical circuit; and (c) detector means responsive to the amount of conduction via the plasma between the conductor and the probes.

Also according to the present invention there is provided a method for testing an electrical part having a plurality of conductive paths thereon, comprising the steps of: (a) directing a laser pulse to impinge upon a conductor of the part under test so as to form a metallic plasma in the vicinity of at least one pair of probes which, along with the conductor and the plasma, form a part of an electrical circuit; and (b) detecting a parameter related to the amount of conduction via the plasma between the conductor and the probes.

According to further features of the described preferred embodiment the apparatus a potential difference is imposed on the probes.

The present invention successfully addresses the shortcomings of the presently known configurations by providing an apparatus and method for non-contact electrical inspection of conductors which is for the accurate inspection of even very small features of printed circuit boards, integrated circuits, LCD's, MCM's and the like.

The present invention discloses a novel system and apparatus which directs laser radiation at a conductor, causing the formation of a metallic plasma which then completes a circuit between two points on the conductor and a pair of nearby probes. The impingement of the laser radiation on the conductor, typically made of copper, causes charge carriers to emerge from the conductor medium. These ate attracted to a nearby probe by an imposed electrical field.

BRIEF DESCRIPTION OF THE DRAWINGS

The invention is herein described, by way of example only, with reference to the accompanying drawings, wherein.

DESCRIPTION OF THE PREFERRED EMBODIMENTS

The present invention is of a system and method for the non-contact electrical inspection of features of a PCB, LCD, MCM and the like.

The principles and operation of a system and method according to the present invention may be better understood with reference to the drawings and the accompanying description.

Figure 1:
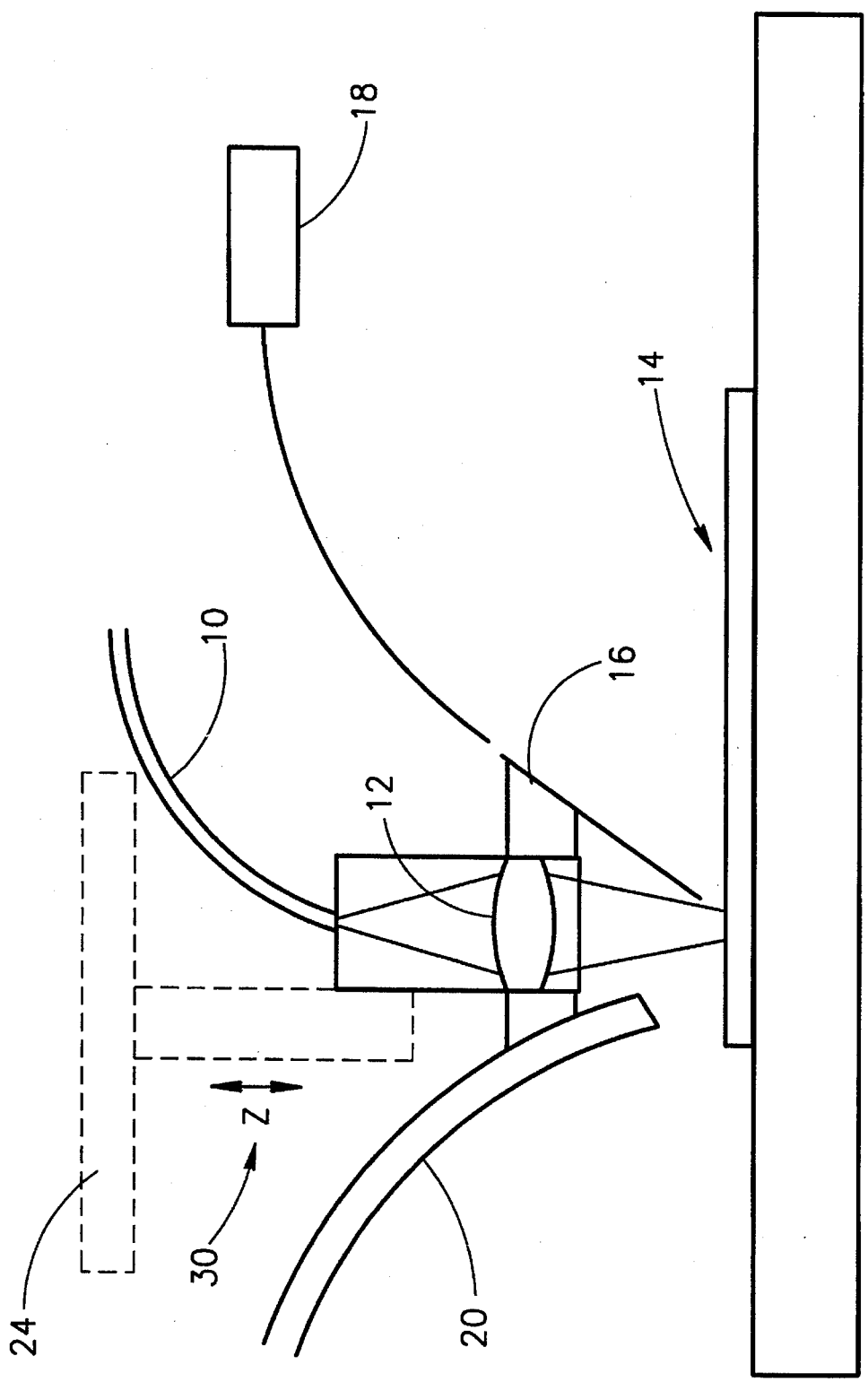
FIG. 1 is a schematic side view of a laser and a probe useful in a system and method according to the present invention.
Figure 2:
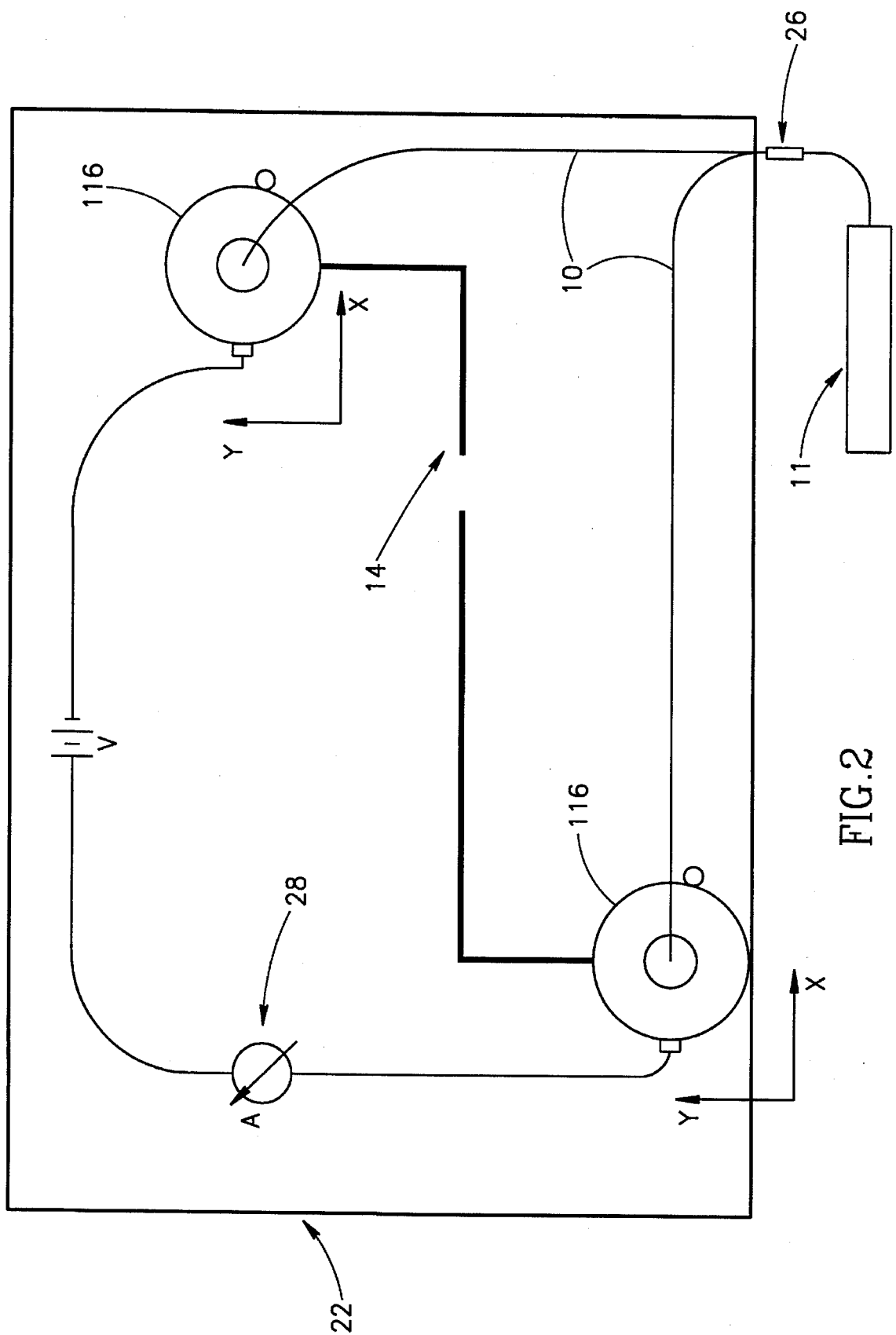
FIG. 2 is a top view of one possible two-probe configuration of a system according to the present invention.

Referring now to the drawings, FIG. 1 illustrates the essence of an apparatus and system according to the present invention. The apparatus is useful in the electrical testing of an electrical part having a plurality of conductive paths thereon. The apparatus makes use of a laser source 11 (FIG. 2) and includes means for directing laser radiation, in the form of a pulses, so as to impinge upon a conductor of the part under test.

The source of pulsed laser radiation may be any convenient source including, but not limited to a Q-switched Nd:YLF or Nd:YAG laser, preferably having an appropriate energy level. The laser radiation may be conducted from the source using an optical fiber 10. The radiation may be focused with the help of a lens 12, or other focusing optics, onto a particular point in a conductor 14, typically made of metal, such as copper, which forms part of the electrical part being tested, such as a printed circuit board, an integrated circuit, and the like.

The impingement of focused laser radiation on conductor 14 brings about an electrical discharge in the form of a metallic plasma, i.e., electrically-conducive plume of charge carriers, which emerges from the metal conductor 14. The emerging electrical discharge is attracted to a probe 16 made of conducting material on which an electric field is imposed, for example, using a high voltage power supply (not shown). A pair of probes 16, along with conductor 14 and the formed plasma, form a part of an electrical circuit.

A detector means 18 which is responsive to the amount of conduction via the plasma between conductor 14 and probe 16. The parameter or parameters measured by detector means 18 may be any parameter which is related to the current passing between conductor 14 and probe 16, including, but not limited to the magnitude of the current or the amount of photons.

It is possible, although not necessary, to enhance the electrical conductivity of the region between conductor 14 and probe 16 by the presence of one or more gases, such as argon, in the region. The gas may be introduced to the region through a gas inlet pipe 20. Alternatively, the part being tested as well as probe 16 may be located inside a closed chamber 22 which may be filled with gas, such as argon. The gas may be at any desirable pressure including atmospheric pressure or pressures which are elevated or lowered with respect to atmospheric pressure.

Preferably, probe 16 and the rest of the assembly (designated 116 in FIG. 2), including lens 12 and, when present, gas inlet pipe 20 are mounted on an X-Y positioning system 24 (shown in more detail in FIG. 2) which is capable of accurately sequentially positioning each probe 16 at various desired locations.

More than a single pair of probes 16 may be used. For each pair of probes 16 laser pulses from laser source 11 are preferably split in a, preferably, 50—50 beam splitter 26 or by two lasers. The splitting of the beam may be achieved by any suitable technique including, but not limited to, the use of an optical beam splitter in the form of a partly transparent body or the use of optical fibers. The use of beam splitter 26 ensures that the two points on conductor 14 are simultaneously hit with laser radiation. The two resultant pulsed beams are carded by optical fibers 10 and are focused on two different points on conductor 14. The two probes 16 of each pair of probes 16, which bear a sizable electrical potential difference, are electrically connected to each other such that, for example, an ammeter 28 placed between the two probes 16 is able to detect any current flowing through the electrical circuit which may be closed when the laser radiation creates a metallic plasma which spans the gap between conductor 14 and probe 16. Thus, when laser beams simultaneously impinges the two points of conductor 14 a plasma is generated which closes an electrical circuit, producing a detectable current and thereby demonstrating the electrical continuity of conductor 14 between the two points being tested.

For optimal performance of the system it is important to maintain a precise fixed optimal distance between probe 16 and conductor 14 since the current depends on the separation between conductor 14 and probe 16. To preserve this fixed separation a suitable mechanism 30 is provided. Mechanism 30 may, for example, an autofocusing system or other such mechanisms.

While the invention has been described with respect to a limited number of embodiments, it will be appreciated that many variations, modifications and other applications of the invention may be made.

What is claimed is:

1. An apparatus for testing an electrical part having a plurality of conductive paths thereon, comprising:
    (a) means for directing a laser pulse to impinge upon a conductor of the part under test so as to form a metallic plasma;
    (b) at least one pair of probes which, along with said conductor and said plasma, form a part of an electrical circuit; and
    (c) detector means responsive to the amount of conduction via said plasma between said conductor and said probes.

2. An apparatus as in claim 1, wherein said means for directing includes focusing optics.

3. An apparatus as in claim 1, wherein said means for directing includes an optical fiber.

4. An apparatus as in claim 1, wherein the electrical part is located in a closed chamber.

5. An apparatus as in claim 4, wherein said closed chamber is filled with a gas.

6. An apparatus as in claim 5, wherein said gas is argon.

7. An apparatus as in claim 5, wherein said gas is an elevated pressure.

8. An apparatus as in claim 5, wherein said gas is a lowered pressure.

9. An apparatus as in claim 1, wherein said pulsed laser is a Q-switched Nd:YAG laser.

10. An apparatus as in claim 1, wherein said pulsed laser is a Q-switched Nd:YLF laser.

11. An apparatus as in claim 1, further comprising an X-Y positioning system for positioning said probes.

12. An apparatus as in claim 1, wherein said means for directing a laser pulse includes at least one optical beam splitter.

13. An apparatus as in claim 1, wherein said means for directing a laser pulse includes at least one fiber optic beam splitter.

14. An apparatus as in claim 1, wherein a potential difference is imposed on said probe.

15. An apparatus as in claim 1, wherein said detector means is a current sensor.

16. An apparatus as in claim 1, wherein said detector means is a photon sensor.

17. A method for testing an electrical part having a plurality of conductive paths thereon, comprising the steps of:

(a) directing a laser pulse to impinge upon a conductor of the part under test so as to form a metallic plasma in the vicinity of at least one pair of probes which, along with said conductor and said plasma, form a part of an electrical circuit; and (b) detecting a parameter related to the amount of conduction via said plasma between said conductor and said probes.

18. A method as in claim 17, further comprising imposing a potential difference said probe.

* * * * *